(12) United States Patent
Tao et al.

(10) Patent No.: US 12,080,570 B2
(45) Date of Patent: Sep. 3, 2024

(54) SEMICONDUCTOR PROCESSING SYSTEM (71) Applicant: ADVANCED MICRO-FABRICATION EQUIPMENT INC. CHINA, Shanghai (CN)

(72) Inventors: Heng Tao, Shanghai (CN); Gerald ZheYao Yin, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 0 days.

(21) Appl. No.: 17/246,218

(22) Filed: Apr. 30, 2021

(65) Prior Publication Data

US 2021/0358781 A1 Nov. 18, 2021

(30) Foreign Application Priority Data

May 11, 2020 (CN) .......................... 202010394080.9

(51) Int. Cl.
*H01L 21/67* (2006.01)
*B65G 47/90* (2006.01)
(Continued)

(52) U.S. Cl.
CPC ........ *H01L 21/67167* (2013.01); *B65G 47/90* (2013.01); *H01L 21/67196* (2013.01);
(Continued)

(58) Field of Classification Search
CPC ......... H01L 21/67161; H01L 21/67173; H01L 21/67769
See application file for complete search history.

(56) References Cited

U.S. PATENT DOCUMENTS 7,819,079 B2 * 10/2010 Englhardt ......... H01L 21/67178
118/503
2007/0119393 A1 5/2007 Ashizawa
(Continued)

FOREIGN PATENT DOCUMENTS

JP 2004335825 * 11/2004 ............. H01L 21/31
JP 2017085072 A 5/2017
(Continued)

*Primary Examiner* — Ronald P Jarrett
(74) *Attorney, Agent, or Firm* — WOMBLE BOND DICKINSON US, LLP (57) ABSTRACT

A semiconductor processing system, including: an elongated transfer chamber including a middle portion, a first end portion disposed at a first end of the middle portion and a second end portion disposed at a second end of the middle portion, wherein at least two lateral semiconductor processing modules attach to the first and second sidewall of the middle portion; the second end portion of the transfer chamber is further attached with one end portion semiconductor processing module, the end portion semiconductor processing module including two process chambers, the two process chambers of the end portion semiconductor processing module being respectively connected to an end face of the second end portion via two air-tight valves; wherein a traverse distance (D4) is provided between the two air-tight valves of the end portion semiconductor processing module, the width of the end face is greater than the traverse distance, and the spacing (D2) between the first and sidewall.

20 Claims, 4 Drawing Sheets

(51) Int. Cl.
 *H01L 21/677* (2006.01)
 *H01L 21/687* (2006.01)

(52) U.S. Cl.
 CPC .. *H01L 21/67126* (2013.01); *H01L 21/67706* (2013.01); *H01L 21/68707* (2013.01)

(56) References Cited

U.S. PATENT DOCUMENTS

| | | |
|---|---|---|
| 2008/0124197 A1 | 5/2008 | van der Meulen et al. |
| 2017/0115657 A1 | 4/2017 | Trussell et al. |
| 2019/0252225 A1 | 8/2019 | Tsuji |
| 2020/0083071 A1* | 3/2020 | Gould ............... H01L 21/67201 |
| 2020/0126844 A1* | 4/2020 | Panda .................... H10B 12/48 |
| 2020/0135521 A1 | 4/2020 | Reuter et al. |

FOREIGN PATENT DOCUMENTS

| | | | | |
|---|---|---|---|---|
| KR | 20140133534 | * | 11/2014 | .......... B25J 15/0019 |
| KR | 20140133534 A | | 11/2014 | |
| TW | 200636899 A | | 10/2006 | |

* cited by examiner

SEMICONDUCTOR PROCESSING SYSTEM

RELATED APPLICATIONS

The present application claims priority to and the benefit of Chinese Patent Application No. 202010394080.9, filed on May 11, 2020, and the disclosure of which is hereby incorporated by reference in its entirety.

TECHNICAL FIELD

Embodiments of the present disclosure relate to semiconductor processing technologies, and more particularly relate to a semiconductor processing system.

BACKGROUND

Semiconductor chips are increasingly applied in various electronic devices. A large number of plasma processors and other processors (e.g., Chemical Vapor Deposition (CVD) processors) are needed during processing of the semiconductor chips. These processors are configured to perform processes such as plasma etching and chemical vapor deposition to the wafers. A semiconductor production line needs to be deployed in a clean room. To keep the number of particles in a clean room below a specified threshold, the clean room is required to be equipped with air intake and exhaust units and required to maintain a long-term running. It is costly to maintain clean rooms. To improve cost-effectiveness, a wafer throughput as large as possible is preferred in a limited clean room space. An optimal semiconductor processing system is one that has a maximum throughput but a minimum footprint.

Figure 1:
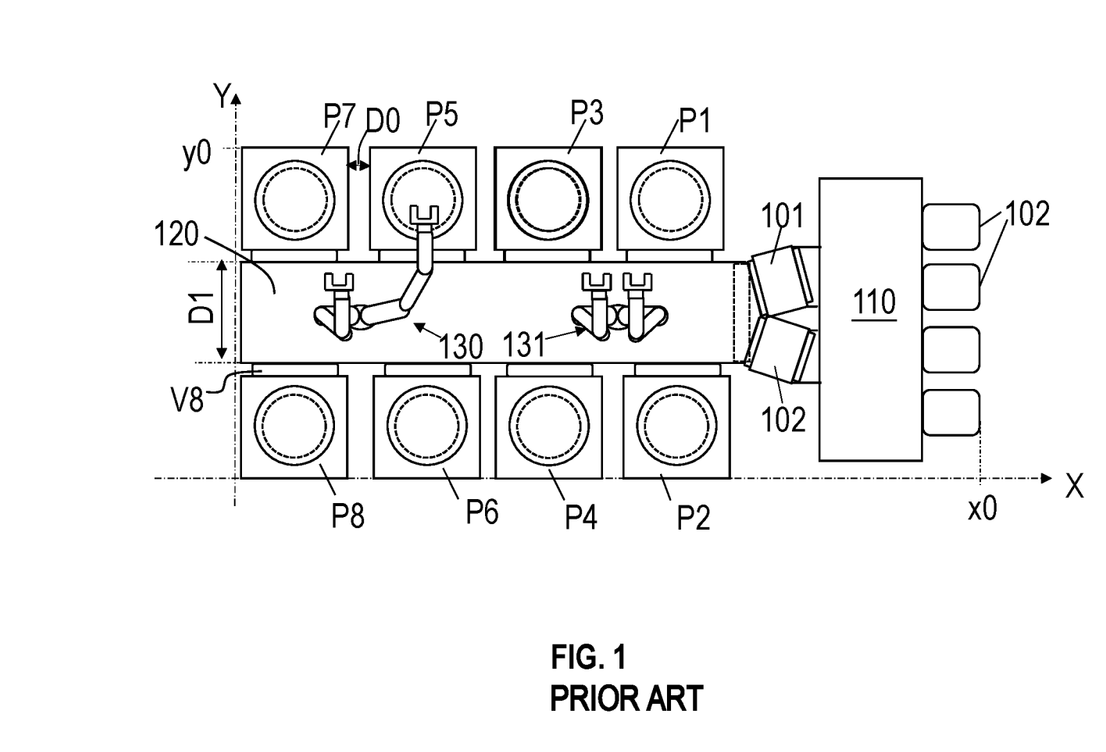
FIG. 1 is a schematic diagram of a conventional semiconductor processing system.

A conventional semiconductor processing system intended for minimized footprint and maximized throughput is illustrated in FIG. 1. The system comprises a vacuum transfer chamber 120, two wafer transportation units 130, 131 which are disposed in the elongated vacuum transfer chamber 120, and a plurality of process chambers P1-P8 attached onto the two elongated sidewalls of the vacuum transfer chamber, wherein those process chambers are respectively communicated to the elongated sidewalls of the vacuum transfer chamber via air-tight valves (e.g., V8). Each of the process chambers P1-P8 has a predetermined gap D0 with respect to neighboring process chambers. A first end of the vacuum transfer chamber 120 includes two front sidewalls arranged with a preset angle, wherein the two front sidewalls are respectively attached with load locks 101, 102. The load locks 101, 102 are respectively communicated, via their own air-tight valves, to an atmospheric transfer chamber 110 (Equipment Front End Module (EFEM)) and the vacuum transfer chamber 120. Opposite the interface with the load locks 101, 102, the atmospheric transfer chamber 110 further comprises a plurality of wafer storage cassettes (Front Opening Unified Pods (FOUP)) 122 positioned in an atmospheric environment, wherein the wafer storage cassettes 122 are configured to store and transfer a large number of wafers between different units of the semiconductor production line for various processing. For example, FIG. 1 illustrates a conventional semiconductor processing system with an overall footprint of x0*y0 and up to 8 process chambers. In order for throughput increase, it is needed to prolong the transfer chamber toward the second end and set additional pairs of process chambers P9, P10 on the prolonged sidewalls. However, such prolonging brings drawbacks: on one hand, the footprint of the whole semiconductor processing system increases; and on the other hand, to transport wafers to a process chamber (e.g., P7, P8) at the second end of the transfer chamber he wafer has to be intermediately transferred between transportation units 131 and transportation units 130; as such, the wafer is introduced into the process chamber by transportation units 130, in which circumstance, further increase of the length of the process chamber needs extra transportation units, such that more transportation units are involved in the transport process to intermediately transfer and transport the wafer. Therefore, in the conventional semiconductor processing system solution, more transportation units are needed with more process chambers mounted, and more relay and handling time is taken, which not only increases costs but also dampens processing efficiency. Furthermore, in the conventional solution, as one robot arm have to deal with four or more process chambers mounted on both sides of the transfer chamber 120, the robot arm is required to obliquely access the process chambers to load/unload wafers, which requires the width D1 between the two sidewalls of the transfer chamber large enough so as to accommodate a larger transportation unit, causing it impossible to reduce the overall footprint of the system. Therefore, the simple practice of extending the length of the transfer chamber to mount more process chambers causes cost increase and processing efficiency deterioration, which cannot improve the actual throughput of the semiconductor processing system, but instead increases the footprint of the overall system and the costs of additional two process chambers and newly added transportation units. In addition, in conventional technologies, the gap D0 between the two sidewalls of each process chamber is designed very narrow, only allowing an arm to access, unable to implement disassembly and maintenance from the sidewalls. As such, for each process chamber, only the front side (available for accessing the transfer chamber) facing the transfer chamber and the back side opposite the front side may serve as the operation sides for disassembly and maintenance, which restricts hardware design options, leaving it difficult to achieve process chambers with optimal cost and effect.

The conventional practices can hardly improve wafer processing throughput; besides, the conventional practices limit the operation space for maintaining process chambers and restrict the flexibility in hardware design for process chambers.

SUMMARY OF THE INVENTION

Embodiments of the present disclosure provide a semiconductor processing system, which enables increase of the processing throughput without much footprint increase of the semiconductor processing system; besides, by improving spatial layout of process chambers, the present disclosure eases maintenance of the semiconductor processing system and simplifies requirements on designing process chambers. In an embodiment of the present disclosure, a semiconductor processing system comprises: an elongated transfer chamber including a middle portion, a first end portion and a second end portion, the first end portion and the second end portion being respectively provided at two ends of the middle portion, wherein at least one lateral semiconductor processing module is respectively provided on a first sidewall and a second sidewall of the middle portion, each lateral semiconductor processing module including two process chambers, the process chambers of the each lateral semiconductor processing module being attached, via their respective air-tight valves, on the first or second sidewall of the middle portion of the transfer chamber; the first end portion of the transfer chamber is communicated to the atmospheric environment via a load lock; the second end portion of the transfer chamber is attached with one end portion semiconductor processing module, the end portion semiconductor processing module including two parallel process chambers, the two process chambers of the end portion semiconductor processing module being respectively connected to the end face of the second end portion via an air-tight valve, the width of the end face being greater than the spacing (D2) between the first sidewall and the second sidewall of the middle portion of the transfer chamber. In an embodiment, the width of the end face is greater than a traverse distance between two air-tight valves on the end portion semiconductor processing module. In this way, the semiconductor processing system according to the present disclosure enables mounting of two process chambers at the narrow end face of the second end portion of the transfer chamber without much increase of the system length.

In an embodiment, the process chambers in the lateral semiconductor processing modules or the end portion semiconductor processing module have different sizes to perform different processing, or have a same size to perform same processing.

Optionally, a first end portion end face is provided on the first end portion of the transfer chamber, and two parallel load locks are further attached onto the first end portion end face, wherein a load lock traverse distance (D4') is provided between the two parallel load locks, the width of the first end portion end face is greater than or equal to the load lock traverse distance, and the spacing (D2) between the first sidewall and the second sidewall of the middle portion of the transfer chamber is less than the load lock traverse distance. In this way, the overall system length at the first end of the transfer chamber is further reduced, thereby reducing the footprint of the system.

In an embodiment, the second end portion of the transfer chamber includes sidewalls gradually extending toward the lateral semiconductor processing modules, such that the distance between the transfer chamber sidewalls in the second end portion gradually extends from the spacing (D2) between the sidewalls of the middle portion till the width of the end face.

Furthermore, in an embodiment, a first and a third lateral semiconductor processing modules are attached onto the first sidewall of the middle portion, and a second and a fourth lateral semiconductor processing modules are attached onto the second sidewall; wherein a first gap space is provided between the first and the third lateral semiconductor processing modules along the vertical length direction of the transfer chamber, the first gap space allowing for access to maintain the process chambers adjacent to the first gap space in the first and third lateral semiconductor processing modules; wherein a second gap space is provided between the second and the fourth lateral semiconductor processing modules along the vertical length direction of the transfer chamber, the second gap space allowing for access to maintain the process chambers adjacent to the second gap space in the second and the fourth lateral semiconductor processing modules. In an embodiment, at least one storage chamber is provided in the first or second gap space, the storage chamber being communicating with the transfer chamber and configured for storing wafers or replacement parts of ring-shaped parts in the process chambers. In this way, the semiconductor processing system can automatically replace the focus rings and perform a cleaning process, which reduces the time of opening a process chamber to replace a part, thereby enhancing utilization of the semiconductor processing system.

In an embodiment, front end sidewalls of the storage chamber pass through the sidewalls of the transfer chamber into the transfer chamber, which reduces squeezing of maintenance space.

In an embodiment, the two process chambers in the end semiconductor processing module and/or in the respective lateral semiconductor processing modules are integrated into one chamber body with a common sidewall, which further reduces the overall length of the system. In an alternative embodiment, a gap less than 100 mm may be provided between the two process chambers in each lateral semiconductor processing module, with the actual processing efficiency per unit area being still greater than conventional system designs.

Preferably, the transfer chamber includes a track T along which a movable transportation unit is movable to thereby enable transferring of wafers between the various process chambers and the load locks. The movable transportation unit includes one movable base and two robot arms. When moving to a position facing a lateral semiconductor processing module, the movable transportation unit loads/unloads the wafers in the lateral semiconductor processing module opposite the position, and when moving to a position adjacent to the second end portion, loads/unloads the wafers in the end portion semiconductor processing module.

DETAILED DESCRIPTION OF EMBODIMENTS

Figure 2:
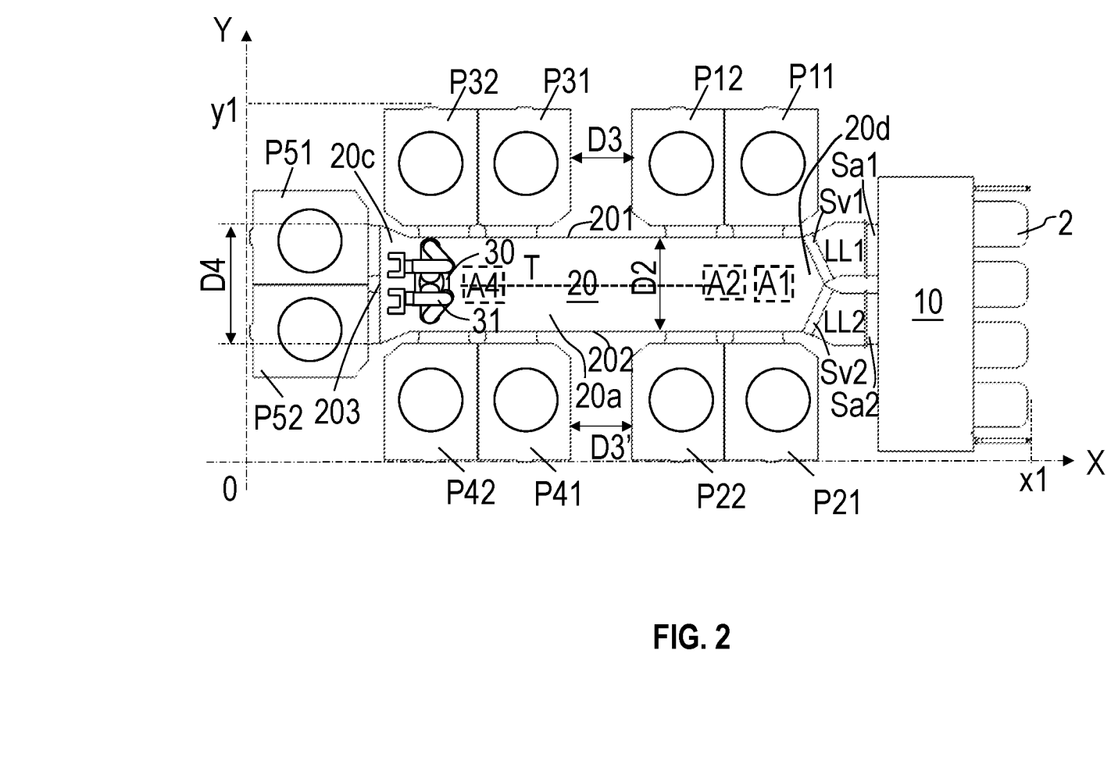
FIG. 2 is a top view schematic diagram of a semiconductor processing system according to the present disclosure.

To solve the above and other problems, embodiments of the present disclosure provide a semiconductor processing system. FIG. 2 is a top view of a semiconductor processing system according to the present disclosure, comprising an atmospheric transfer chamber 10 which includes a first side that is attached with a plurality of wafer storage cassettes 2. The other side of the atmospheric transfer chamber 10 is attached with a first load lock LL1 via an air-tight valve Sa1 and attached with a second load lock LL2 via an air-tight valve Sa2. The first load lock LL1 is connected to a vacuum transfer chamber 20 via an air-tight valve Sv1, and the second load lock LL2 is connected to the vacuum transfer chamber 20 via an air-tight valve Sv2. The atmospheric transfer chamber 10 includes a robot arm in the atmospheric environment, the robot arm being configured for transferring wafers from the wafer storage cassettes 2 to the first and second load locks. The vacuum transfer chamber 20 is of an elongated shape, comprising a first sidewall 201 and a second sidewall 202, and further comprising a middle portion 20a, an end portion 20d at a first end of the transfer chamber 20 and an end portion 20c at a second end of the transfer chamber 20. The first sidewall 201 and the second sidewall 202 are parallel arranged at two sides of the middle portion 20a, and a plurality of lateral semiconductor processing modules are further provided on the first sidewall 201 and the second sidewall 202. Each lateral semiconductor processing module includes a pair of parallel arranged and mutually abutting process chambers, wherein the first lateral semiconductor processing module includes process chambers P11, P12, the second lateral semiconductor processing module includes process chambers P22, P21, the third lateral semiconductor processing module includes process chambers P31, P32, and the fourth lateral semiconductor processing module includes process chambers P41, P42, wherein the first and second lateral semiconductor processing modules are disposed at corresponding positions of the two sides of the transfer chamber, the third and fourth lateral semiconductor processing modules are also disposed at corresponding positions of the two sides of the transfer chamber, A track is provided in the transfer chamber, and a wafer handling unit is provided on the track, wherein the wafer handling unit includes a movable base 30 on which at least one robot arm 31 is provided for loading/unloading wafers. In the case of providing two robot arms on the base, loading a processed wafer and unloading a to-be-processed wafer into the transfer chamber are enabled concurrently, further enhancing the loading/unloading efficiency as well as the transport efficiency. The width of the middle portion 20a, i.e., the distance D2 between the first sidewall and the second sidewall, needs to be designed as small as possible so as to reduce the footprint of the overall semiconductor processing system. In an embodiment of the present disclosure, the first sidewall 201 and the second sidewall 202 extend in mutually distant directions from the end portion 20C of the transfer chamber to form an extended space, which results in increase of the spacing between the first sidewall 201 and the second sidewall 202 at the end portion 20c, wherein the resulting spacing is required to be greater than the traverse distance D4 between two air-tight valves in one semiconductor processing modules. The traverse distance refers to the traverse width between two air-tight valves on the parallel arranged and mutually abutting two process chambers in the Y-axis direction, which is the sum of the opening widths of the two air-tight valves and the distance between adjacent sidewalls of the two air-tight valves. As the end face 203 is wide enough, the end face 203 of the second end portion of the transfer chamber can accommodate two openings; the air-tight valves on a fifth semiconductor processing module match the two openings of the end face 203, thereby realizing mutual communication between the two process chambers P51, P52 and the transfer chamber 20. Here, the fifth semiconductor processing module refers to the end portion semiconductor processing module. The width of the end face 203 is greater than 115% of the spacing D2 between the first sidewall and the second sidewall of the middle portion. In an alternative embodiment, the width of the end face 203 is greater than 125% of the spacing D2 between the first sidewall and the second sidewall of the middle portion.

Figure 3:
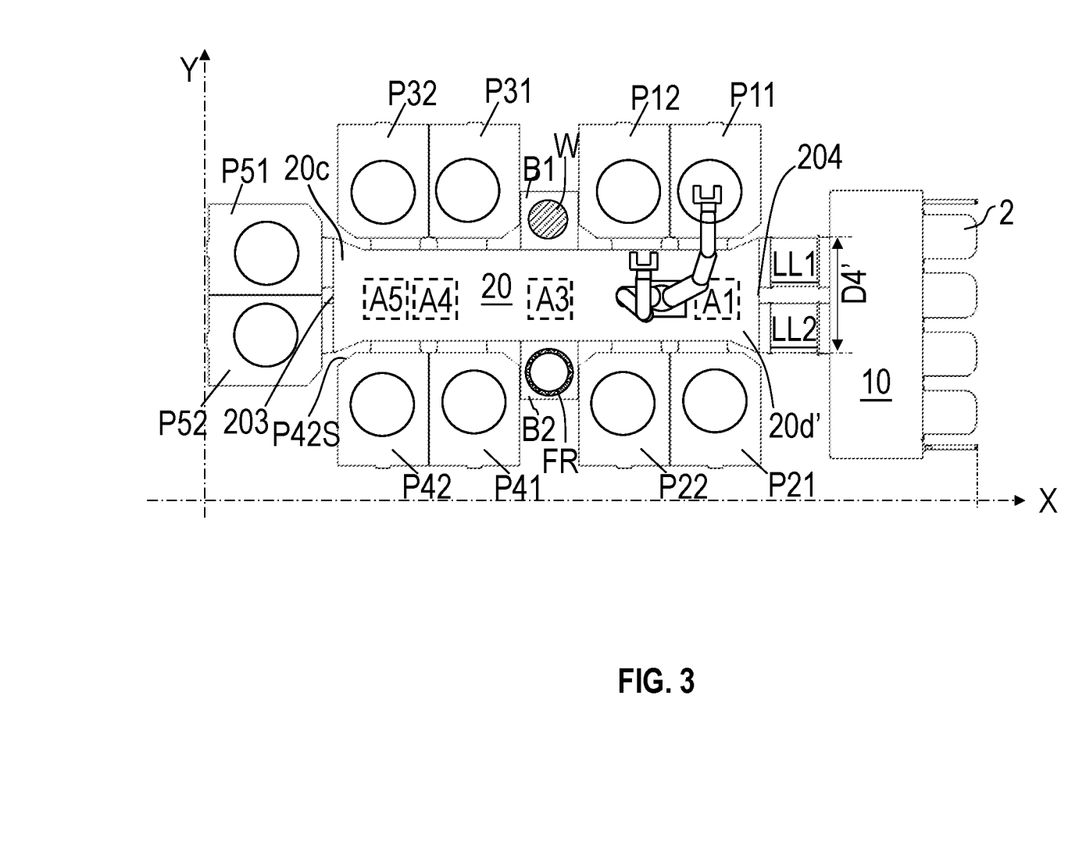
FIG. 3 is a top view schematic diagram of a semiconductor processing system according to another embodiment of the present disclosure.

In an embodiment, an enough large spacing D3 is provided in the X direction between sidewalls of the first and second semiconductor processing modules at the same side of the transfer chamber, the spacing D3 being configured to allow an operator to access (e.g., D3>500 mm), such that after accessing the maintenance space enclosed by the sidewall 201 of the transfer chamber and the process chambers P12, P13, the operator may perform maintenance from both sides of the process chambers P12, P13. An opposite maintenance space is also provided between two semiconductor processing modules at the opposite side of the transfer chamber. During processing, the movable base 30 first moves to position A1 in the transfer chamber to unload the wafers from the load locks LL1, LL2, and then moves to position A2 to introduce wafers into the process chambers P11, P12 or process chambers P21, P22, or moves to position A4 as desired to introduce wafers into the process chambers P31, P32 or process chambers P41, P42, and may further move through position A4 to position A5 (as shown in FIG. 3) deep in the transfer chamber to introduce wafers into the process chambers P51, P52. The process of unloading the processed wafer is reverse to the movement direction of the above process, but the operation contents are identical, which is thus not detailed here.

The movement positions A1-A5 are only an example of the operating manner of the semiconductor processing system according to the present disclosure. In actuality, more wafer transport methods are possible. For example, the position of the first semiconductor processing module mounted on the sidewall 201 is misaligned with the position of the opposite second semiconductor processing module, and the load lock positions for the process chambers P11 and P21 are misaligned with the load lock positions for the process chambers P12 and P22; in this case, the transportation unit may be driven to stop at the front face of the first semiconductor processing module to load/unload wafers, and then moves slightly to the position corresponding to the opposite second semiconductor processing module to load/unload wafers. As the transportation unit provided in the present disclosure is horizontally movable along the track, it may move to the position facing a process chamber from any position in the track, for the robot arm to unload wafers; as such, the horizontally movable transportation unit narrows the range of movement of the robot arm 31, which facilitates driving and controlling the robot arm. As the X-direction movement is driven by the horizontal movement of the base 30, in order to load/unload wafers, the robot arm 21 is only required to access the process chamber vertically or nearly vertically, rendering a small range of movement of the robot arm; therefore, the spacing D2 between the sidewalls of the transfer chamber in the present disclosure is smaller than the value of the spacing D1 between the sidewalls of a conventional transfer chamber.

In an embodiment of the semiconductor processing system according to the present disclosure, each of the both sides of the fifth semiconductor processing module includes an enough large space as a maintenance space; therefore, a maintenance space is provided for respective sidewalls of each process chamber of the first to fifth semiconductor processing modules, i.e., each process chamber includes 3 maintenance-enabled faces: the front face (air-tight valve mounting face), the back face, and the side facing the maintenance space. Meanwhile, as the end portion 20c extends toward the two sides from preset positions of the air-tight valves of the process chambers P31, P42 proximal to the second end till the width of the sidewall 203 of the end face of the second end reaches D4, wherein the second end face 203 is substantially in flush with the sides of the process chambers P32, P42, only the body length of the process chambers P51, P52 at the second end increases for the semiconductor processing system according to the present disclosure. However, as the adjacent process chambers (e.g., P12, P11) are mutually integrated into a semiconductor processing process module, such that the maintenance spaces are merged into one operating space accessible to an operator, which enlarges the maintenance faces of the processing system. As a result, the overall footprint only increases slightly, i.e., X1*Y1, while the number of process chambers increases by two, thereby optimizing the processing efficiency and footprint of the system.

Preferably, by providing two robot arms on the base, wafer loading/unloading in a process chamber may be performed concurrently, i.e., when wafer processing is completed in one process chamber, one robot may unload the processed wafer and meanwhile the other robot arm may place the to-be-processed wafer; afterwards, the two robot arms move together to the respective load locks to perform wafer exchange again. In this way, one transportation unit can perform unloading of the processed wafer and place of the to-be-processed wafer in a faster manner, and the transportation of ten process chambers can be realized by only one wafer handling unit.

In an embodiment, the two process chambers in each semiconductor processing module are two standalone process chambers abutting to each other; in an alternative embodiment, the two process chambers in each semiconductor processing module are one integral piece, but partitioned into two process spaces by a common partition wall, which may further reduce the width of the sidewalls of the process chambers. Besides, after the two process chambers are integrated into process chamber, they may share one exhaust system, which may further reduce the lower space and the manufacturing cost of process chambers.

FIG. 3 shows another embodiment of the present disclosure. Compared with the first embodiment of the present disclosure shown in FIG. 2, the two sidewalls of the end portion 20d' of the first end of the transfer chamber extends towards the two sides such that the width of the first end portion end face 204 is sufficient to parallel mount the air-tight valves of the two load locks LL1, LL2, i.e., the width is greater than the traverse distance D4' between the two load locks. The traverse distance D4' between the two load locks is the sum of the opening widths of the air-tight valves of the two load locks and the distance between the adjacent sidewalls of the air-tight valves. In an embodiment, the width of the traverse distance D4' is proximal to or slightly less than the width D4 of the second end portion end face 203, but still far larger than the width D2 of the middle portion 20a. In contrast with the conventional technology which requires that the two load locks be arranged in a certain angle, the arrangement of the first end of the transfer chamber according to the present disclosure may reduce the distance between the first end of the transfer chamber and the atmospheric transfer chamber, further reducing the overall length of the semiconductor processing system to X2 (where x2<x1<x0). Besides, the embodiment shown in FIG. 3 further provides an improved solution: adding a first storage chamber B1 in the maintenance space between the first and second semiconductor processing modules; and adding a second storage chamber B2 in the maintenance space between the third and fourth semiconductor processing modules, wherein the first chamber B1 and the second chamber B2 directly communicate with the transfer chamber 20. In the first chamber B1, a recyclable dummy wafer W for plasma cleaning the process chambers may be provided. The process chambers need a plasma cleaning step after performing one or more processing; in this case, the dummy wafer W may be introduced into the reaction chamber by a robot arm; after the corresponding cleaning step is completed, the robot arm removes the dummy wafer W back into the storage chamber B1. As the dummy wafer W and the to-be-processed wafer have the same size, i.e., 300 mm, it is only required that the size of the storage chamber be slightly greater than the size of the wafer, which does not affect the maintenance space from performing corresponding maintenance operations. A plurality of vertically stacked dummy wafers may be provided in the storage chamber so as to satisfy the requirement of cleaning a plurality of process chambers. The second storage chamber B2 may be used for storing replacing focus rings FR. As plasma processing is frequently performed in various process chambers, long-term plasma processing causes wear to the focus ring, edge ring, or other process kits surrounding the processed wafers. To ensure plasma processing effect, such rings or kits need to be replaced at a predetermined interval. However, in conventional technologies, the load locks LL1, LL2 and the wafer storage cassettes 2 are all designed for wafer transport, which are ineligible for long-term storing large-sized process kits such as focus rings of a larger size. The present disclosure enables introduction of the focus rings into the second storage chamber B2 via the atmospheric transfer chamber (EFEM) and the load locks, such that in the case of replacing a focus ring, the worn focus ring in the process chamber can be replaced by the focus ring taken out from within the storage chamber B2. In an alternative embodiment, enough process kits may be deposited into the storage chamber B2 when opening the to-be-maintained process chamber, wherein laminated storage spaces may be provided in the storage chamber B2 to store a plurality of focus rings. In the present disclosure, the first storage chamber B1 and the second storage chamber B2 may optionally have the same structure and function, and they may both be used for storing wafers or ring-shaped process kits such as focus rings; as such, a user may autonomously select the items and numbers stored respectively in the two storage chambers based on process requirements. In an optional embodiment, the sidewalls of the transfer chamber may be mounted with only one storage chamber, e.g., B1, while a plurality of wafers and focus rings may be placed in a single storage chamber; or, only wafers are stored therein in daily processing, while the focus rings are placed in the storage chambers only when there is a need to replace the focus rings.

Figure 4:
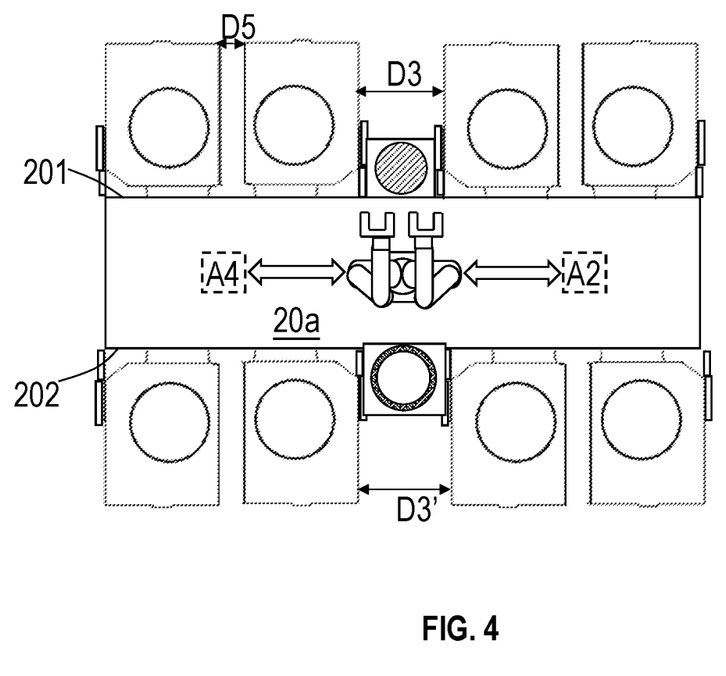
FIG. 4 is a top view schematic diagram of a semiconductor processing system according to a further embodiment of the present disclosure.

A third embodiment of the semiconductor processing system is provided in FIG. 4, which shows a schematic diagram of a middle portion 20a of the transfer chamber 20, where the storage chamber B2 has a larger size, such that the front end face of the storage chamber may project into the transfer chamber and run across the sidewall 202 of the transfer chamber, thereby reducing the impact on the maintenance space between the third and fourth semiconductor processing modules. The transportation unit transfers wafers between the storage chambers and the process chambers as well as between the process chambers and the load locks.

In an embodiment of the present disclosure, a predetermined gap may be provided between the two process chambers in each processing module of the semiconductor processing system, as shown in FIG. 4; the gap distance D5 may be less than D0 in conventional technologies, usually less than 100 mm. According to the present disclosure, with slight footprint increase at the second end of the transfer chamber, two additional process chambers are achieved, and meanwhile, the maintenance space of each process chamber increases, and the design flexibility for process chambers is improved. Moreover, by providing two storage chambers in the maintenance spaces at the two sides of the transfer chamber, the processing efficiency of the cleaning step is improved, and automatic replacement of the process kits such as the focus rings is enabled, avoiding the limitations in conventional technologies where the focus ring can only be replaced when opening the to-be-maintained process chamber. The various technical effects mentioned above may all be realized by the semiconductor processing system according to the present disclosure. Therefore, the semiconductor processing system as described herein may significantly enhance the wafer processing efficiency with only slight increase of the footprint or even without increase of the footprint, and meanwhile facilitates maintenance and designing of the process chambers, thereby achieving cost-effectiveness maximization of the semiconductor processing system.

In the semiconductor processing system according to the present disclosure, irrespective of the process chambers P11-P42 mounted to the sidewalls 201, 202 of the transfer chamber 20 or the process chambers P51 and P52 mounted to the end face processing modules at the end face 203 of the transfer chamber, they can perform the same processing and have the same hardware structure; in an alternative embodiment, they may be designed for different processing, particularly for sequential processing. For example, P11-P42 perform plasma etching processing; and after the etching processing is completed, the wafers are transported into the process chambers P51, P52 to remove the etching mask. Or, the etching processing is performed in the first process chamber, while the deposit processing is performed in the second process chamber. With such a combination of process chambers performing different processing, it becomes unnecessary to transport, after the current processing is completed, wafers to the wafer storage cassettes 2 in the atmospheric environment via load locks and then transport the processed wafer to another semiconductor processing system that performs next processing; instead, the processed wafer may be directly transported to the next process chamber in the same semiconductor processing system in the vacuum environment, thereby avoiding transferring and switching between different environments, which saves transport time, reduces the odds of contamination, and further enhances the processing efficiency of the semiconductor processing system. In the present disclosure, as the process chambers performing different processing have different exterior sizes, the sizes of the maintenance spaces formed by the gaps between neighboring semiconductor processing modules at the same side also vary. As shown in FIGS. 2 and 4, the gap distance between the first and third semiconductor processing modules on the sidewall 201 is D3; and the gap distance between the second and fourth semiconductor processing modules mounted on the sidewall 202 is D3', where the value of D3' may be different from D3. When different process chambers are mounted to one transfer chamber, due to employment of a linearly and horizontally movable transportation unit, the base 30 of the transportation unit may move to corresponding positions of different process chambers, which reduces the range of movement of the robot arm 31. In the conventional semiconductor processing systems, as the plurality of robot arms are immobile, the robot arms are required to have different motion tracks to adapt to different models of process chambers in the case of replacing one or more process chambers of different sizes, which significantly increases the difficulty of system upgrade. Therefore, the semiconductor processing system provided by the present disclosure is adapted to system structures formed by combination of different types of process chambers, offering a flexibility for system settings.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

What is claimed is:

1. A semiconductor processing system, comprising: an elongated transfer chamber including a middle portion, a first end portion and a second end portion, the first end portion and the second end portion being respectively provided at two ends of the middle portion, wherein a first sidewall and a second sidewall of the middle portion are parallel to each other, and wherein the first sidewall and the second sidewall extend in mutually distant directions to form an extended space, resulting in increase of spacing between the first sidewall and the second sidewall at the second end portion;
    wherein two lateral semiconductor processing modules comprising a first and a third lateral semiconductor processing modules are provided on the first sidewall and two lateral semiconductor processing modules comprising a second and a fourth lateral semiconductor processing modules are provided on the second sidewall of the middle portion, each lateral semiconductor processing module including two process chambers having predetermined gap between the two processing chambers, the process chambers in each lateral semiconductor processing module being attached, via their respective air-tight valves, to the first or second sidewall of the middle portion of the transfer chamber;
    wherein the first end portion of the transfer chamber is communicated to atmospheric environment via a load lock; and
    wherein the second end portion of the transfer chamber is attached with one end portion semiconductor processing module, the end portion semiconductor processing module including two process chambers, the two process chambers of the end portion semiconductor processing module being respectively connected to an end face of the second end portion via an air-tight valve;
    wherein a first gap space larger than the predetermined gap and larger than 500 mm is provided between the first and the third lateral semiconductor processing modules along the elongate direction of the transfer chamber, the first gap space allowing for access to maintain the process chambers adjacent to the first gap space in the first and third lateral semiconductor processing modules; and
    wherein a second gap space larger than the predetermined gap and larger than 500 mm is provided between the second and the fourth lateral semiconductor processing modules along the elongate direction of the transfer chamber, the second gap space allowing for access to maintain the process chambers adjacent to the second gap space in the second and the fourth lateral semiconductor processing modules.

2. The semiconductor processing system according to claim 1, wherein a traverse distance (D4) is provided between two air-tight valves of the end portion semiconductor processing module, width of the end face is greater than or equal to the traverse distance, and the spacing (D2) between the first sidewall and the second sidewall of the middle portion of the transfer chamber is less than the traverse distance.

3. The semiconductor processing system according to claim 1, wherein at least one storage chamber is provided in the first or second gap space, the storage chamber communicating with the transfer chamber and configured for storing wafers or replacement ring parts in the process chambers.

4. The semiconductor processing system according to claim 3, wherein two storage chambers are respectively provided in the first and second gap spaces.

5. The semiconductor processing system according to claim 4, wherein the storage chambers have different sizes than the process chambers.

6. The semiconductor processing system according to claim 3, wherein a front end sidewall of the least one storage chamber passes through the sidewalls of the transfer chamber to extend into the transfer chamber.

7. The semiconductor processing system according to claim 3, wherein the at least one storage chamber is projected into the transfer chamber across the first or second sidewalls.

8. The semiconductor processing system according to claim 1, wherein the two process chambers in the end portion semiconductor processing module and/or respective lateral semiconductor processing modules are integrated into one chamber body with a common sidewall.

9. The semiconductor processing system according to claim 1, wherein the predetermined gap provided between the two process chambers in the respective lateral semiconductor processing modules being less than 100 mm.

10. The semiconductor processing system according to claim 1, wherein the second end portion of the transfer chamber includes sidewalls gradually extending toward the lateral semiconductor processing modules, such that the distance between the transfer chamber sidewalls in the second end portion gradually extends from the spacing (D2) between the sidewalls of the middle portion till the width of the end face.

11. The semiconductor processing system according to claim 1, wherein the transfer chamber includes a track along which a movable transportation unit having a base and at least one robot arm is movable to thereby enable transferring of wafers between the various process chambers and the load locks.

12. The semiconductor processing system according to claim 11, wherein the movable transportation unit includes one movable base and two robot arms.

13. The semiconductor processing system according to claim 11, wherein when moving to a position facing the lateral semiconductor processing module, the movable transportation unit loads/unloads wafers in the lateral semiconductor modules, and when moving to a position adjacent to the second end portion, load/unload the wafers in the end portion semiconductor processing module.

14. The semiconductor processing system according to claim 1, wherein the process chambers in the respective lateral semiconductor processing modules or the end portion semiconductor processing module have different sizes to perform different processes.

15. The semiconductor processing system according to claim 1, wherein the process chambers in the lateral semiconductor processing modules or the end portion semiconductor processing module perform the same process.

16. The semiconductor processing system according to claim 1, wherein a first end portion end face is provided on the first end portion of the transfer chamber, and two parallel load locks are further attached onto the first end portion end face, wherein a load lock traverse distance (D4') is provided between the two parallel load locks, the first end portion end face having width that is greater than or equal to the load lock traverse distance, and the spacing (D2) between the first sidewall and the second sidewall of the middle portion of the transfer chamber is less than the load lock traverse distance.

17. A semiconductor processing system, comprising: a elongated transfer chamber including a middle portion, a first end portion and a second end portion, the first end portion and the second end portion being respectively provided at two ends of the middle portion, wherein a first sidewall and a second sidewall of the middle portion are parallel to each other, and wherein the first sidewall and the second sidewall extend in mutually distant directions to form an extended space, resulting in increase of spacing between the first sidewall and the second sidewall at the second end portion;
  wherein at least two lateral semiconductor processing modules, including a first and a third lateral semiconductor processing modules, are provided on the first first sidewall and wherein at least two lateral semiconductor processing modules, including a second and a fourth lateral semiconductor processing modules are provided on the second sidewall of the middle portion, each lateral semiconductor processing module including two process chambers having predetermined gap between the two processing chambers, the process chambers of the each lateral semiconductor processing module being attached, via their respective air-tight valves, to the first or second sidewall of the middle portion of the transfer chamber;
  wherein the first end portion of the transfer chamber is communicated to atmospheric environment via a load lock; and
  wherein the second end portion of the transfer chamber is attached with one end portion semiconductor processing module, the end portion semiconductor processing module including two parallel process chambers, the two process chambers of the end portion semiconductor processing module being respectively connected to an end face of the second end portion via an air-tight valve; and
  wherein a first gap space larger than the predetermined gap and larger than 500 mm is provided between the first and the third lateral semiconductor processing modules along the vertical length direction of the transfer chamber, the first gap space allowing for access to maintain the process chambers adjacent to the first gap space in the first and third lateral semiconductor processing modules;
  wherein a second gap space larger than the predetermined gap and larger than 500 mm is provided between the second and the fourth lateral semiconductor processing modules along the vertical length direction of the transfer chamber, the second gap space allowing for access to maintain the process chambers adjacent to the second gap space in the second and the fourth side semiconductor modules.

18. The semiconductor processing system according to claim 17, wherein the width of the end face being greater than a spacing (D2) between the first sidewall and the second sidewall of the middle portion of the transfer chamber.

19. The semiconductor processing system according to claim 18, wherein the width of the end face is greater than a traverse distance between two air-tight valves on the end portion semiconductor processing module.

20. The semiconductor processing system according to claim 17, wherein at least one storage chamber is provided in the first or second gap space, the storage chamber being communicating with the transfer chamber and configured for storing wafers or replacement parts of ring-shaped parts in the process chambers.

* * * * *